United States Patent
Han et al.

(10) Patent No.: US 7,406,110 B2
(45) Date of Patent: Jul. 29, 2008

(54) METHOD AND APPARATUS FOR CONTROLLING POWER OF LASER DIODES

(75) Inventors: Suk-gyun Han, Seongnam-si (KR); Duk-soo Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 297 days.

(21) Appl. No.: 10/958,621

(22) Filed: Oct. 6, 2004

(65) Prior Publication Data
US 2005/0078723 A1   Apr. 14, 2005

(30) Foreign Application Priority Data
Oct. 13, 2003   (KR) .................. 10-2003-0070987

(51) Int. Cl.
*H01S 3/00* (2006.01)
(52) U.S. Cl. ................... 372/38.02; 372/38.07
(58) Field of Classification Search ............ None
See application file for complete search history.

(56) References Cited

U.S. PATENT DOCUMENTS

| | | | | |
|---|---|---|---|---|
| 5,659,414 A | * | 8/1997 | Appel et al. ........... | 359/196 |
| 5,701,554 A | * | 12/1997 | Tanaka et al. .......... | 399/69 |
| 5,812,420 A | * | 9/1998 | Takahashi ............. | 700/280 |
| 6,178,029 B1 | * | 1/2001 | Kamikubo ............. | 359/204 |
| 6,389,046 B1 | * | 5/2002 | Stayt et al. ............ | 372/29.02 |
| 6,396,561 B1 | * | 5/2002 | Vernackt et al. ........ | 355/26 |
| 6,414,778 B1 | * | 7/2002 | Hori .................... | 359/204 |
| 6,862,304 B2 | * | 3/2005 | Maurer et al. .......... | 372/36 |
| 2004/0032889 A1 | * | 2/2004 | Hidaka et al. .......... | 372/38.02 |
| 2004/0032890 A1 | * | 2/2004 | Murata ................. | 372/38.02 |

FOREIGN PATENT DOCUMENTS

| | | |
|---|---|---|
| CN | 1387187 | 12/2002 |
| JP | 63293568 | 11/1988 |
| JP | 3068912 | 3/1991 |

* cited by examiner

*Primary Examiner*—Minsun Harvey
*Assistant Examiner*—Tuan N. Nguyen
(74) *Attorney, Agent, or Firm*—Roylance, Abrams, Berdo & Goodman, LLP

(57) ABSTRACT

A method and apparatus for controlling the power of laser diodes are provided. The apparatus includes an output voltage sensor, which senses output voltages of at least two laser diodes and outputs the output voltages to an optical power controller. The optical power controller generates control voltages for controlling the at least two laser diodes by performing proportional-integral (PI) control on error voltages between reference voltages and the output voltages received from the output voltage sensor.

5 Claims, 6 Drawing Sheets

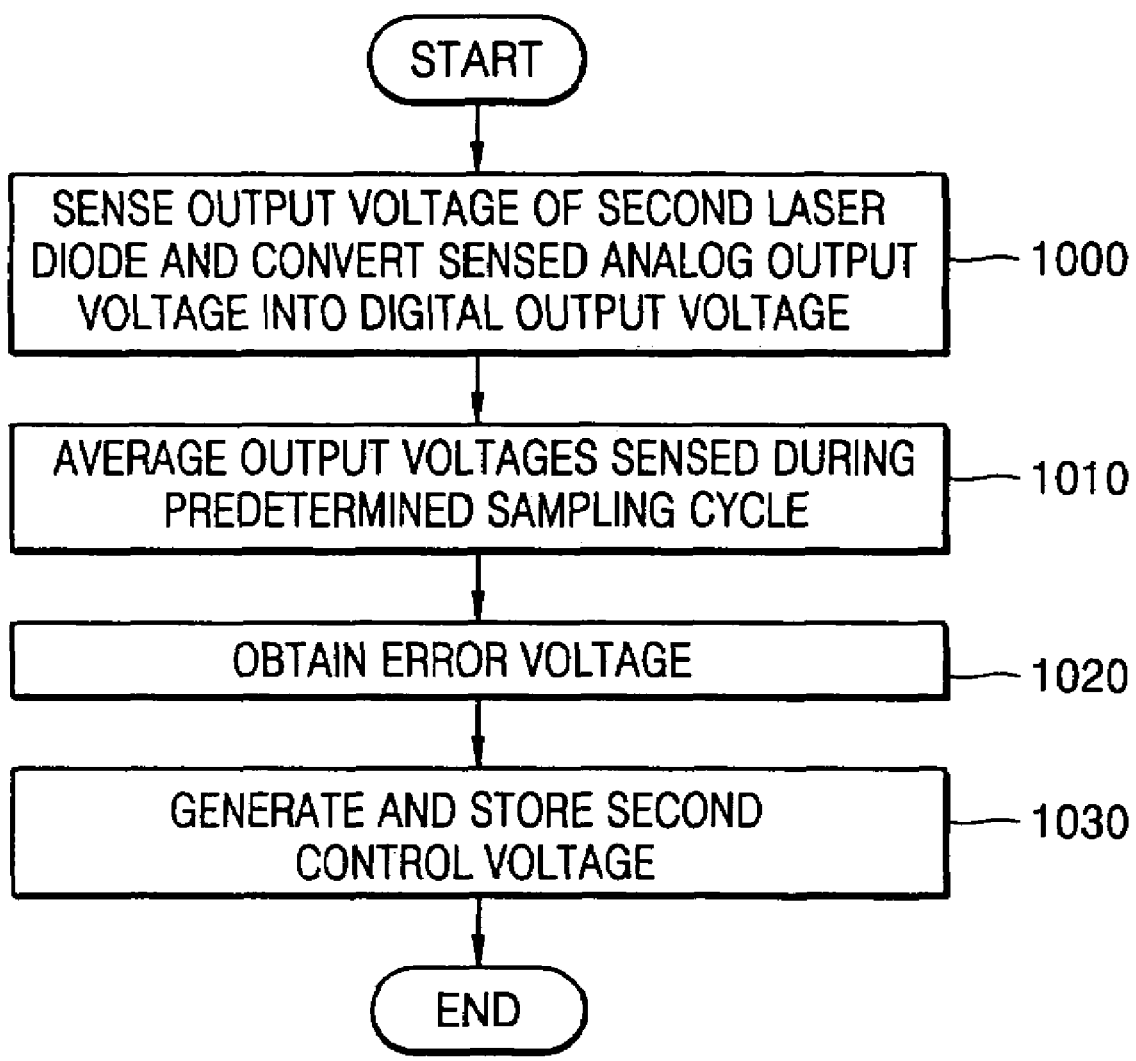

METHOD AND APPARATUS FOR CONTROLLING POWER OF LASER DIODES

CROSS-REFERENCE TO RELATED APPLICATIONS

This application claims the benefit under 35 U.S.C. §119(a) of Korean Patent Application No. 2003-70987, filed on Oct. 13, 2003, in the Korean Intellectual Property Office, the entire disclosure of which is incorporated herein by reference.

BACKGROUND OF THE INVENTION

1. Field of the Invention

The present invention relates to a power-controlling device for a laser diode. More particularly, the present invention relates to a method and apparatus for controlling the power of laser diodes in a laser scanning unit.

2. Description of the Related Art

In general, laser printers are devices for printing images on a sheet of printing paper by imaging laser beams emitted from a laser diode in response to video signals of an input image and transferring a latent image formed on a photosensitive drum to the sheet of printing paper.

FIG. 1 is a block diagram of a conventional apparatus for controlling the power of laser diodes. Referring to FIG. 1, the apparatus comprises first and second optical power controllers 110 and 111, first and second laser diode drivers 120 and 121, a laser scanning unit 130, which includes first and second laser diodes 131 and 133 and first and second light receivers 132 and 134, first and second output voltage sensors 140 and 141, and a printer controller 100.

The printer controller 100 preferably provides first and second reference voltages V_ref1 and V_ref2 for driving the first and second laser diodes 131 and 133. More specifically, the optical power of each of the first and second laser diodes 131 and 133 varies depending on the temperature of the laser scanning unit 130. Therefore, in order to provide the first and second laser diodes 131 and 133 with a desired intensity of recording power under any circumstances, that is, regardless of temperature variations, the first and second reference voltages V_ref1 and V_ref2 applied to the laser diodes 131 should be adjusted according to the temperature of the laser scanning unit 130.

The first optical power controller 110 receives a first control voltage, which approximates the first reference voltage V_ref1, by subtracting an output voltage of one of the first and second laser diodes 131 and 133 from the first reference voltage V_ref1 during a non-imaging period. The first optical power controller 110 performs a proportional-integral (PI) control on a subtraction result, such as an error voltage, to obtain the first control voltage. Likewise, the second optical power controller 111 obtains a second control voltage, which approximates the second reference voltage V_ref2, by subtracting the output voltage of the other of the first and second laser diodes 131 and 133 from the second reference voltage V_ref2 during the non-image period. As above, the second optical power controller 111 performs a proportional-integral (PI) control on a subtraction result, such as an error voltage, to obtain the second control voltage. Thereafter, the first and second optical power controllers 110 and 111 output the first and second control voltages, respectively, to the laser diode drivers 120 and 121, respectively.

The first and second laser diode drivers 120 and 121 drive the first and second laser diodes 131 and 133 using the first and second control voltages received from the optical power controllers 110 and 111, respectively.

The first and second light receivers 132 and 134 sense output currents of the laser diodes 131 and output sensing results to the first and second output voltage sensors 140 and 141, respectively.

In a case where the conventional apparatus for controlling the power of laser diodes includes two or more laser diodes, it needs as many optical power controllers and peripheral circuits (such as, light receivers and output voltage sensors) as the laser diodes. Therefore, as the number of laser diodes increases, the size of an entire board on which the conventional apparatus for controlling the power of laser diodes is realized increases, as does power consumption. In addition, since a reference quantity of light has a fixed value, the conventional apparatus for controlling the power of laser diodes cannot appropriately respond to various environmental factors, such as the temperature of the laser scanning unit 130 or the temperature and humidity inside a laser printer.

SUMMARY OF THE INVENTION

The present invention provides a method and apparatus for controlling the power of laser diodes, which are capable of simultaneously driving two or more laser diodes.

The present invention also provides a method and apparatus for controlling the power of laser diodes, which are capable of printing more lines of video data at a given printing speed than their counterparts in the prior art because two or more laser diodes are used.

According to an aspect of the present invention, there is provided an apparatus for controlling the power of laser diodes, which generates control voltages during a non-imaging period and drives laser diodes using the control voltages during an imaging period. The apparatus includes an output voltage sensor, which senses the output voltages of at least two laser diodes and outputs the output voltages to an optical power controller. The optical power controller generates control voltages for controlling the at least two laser diodes by performing proportional-integral (PI) control on error voltages between reference voltages and the output voltages received from the output voltage sensor.

The output voltage sensor may include an analog-to-digital converter, which converts an analog output voltage into a digital output voltage; and a calculator, which processes the digital output voltage and outputs a processing result to the optical power controller.

The calculator may receive the digital output voltage at every predetermined sampling cycle during the non-imaging period, average the digital output voltages received during each predetermined sampling cycle, and output an average digital output voltage to the optical power controller.

The optical power controller may include a multiplexer, a subtractor, a PI controller, and at least two digital-to-analog converters. The multiplexer selectively outputs one of the reference voltages to the optical power controller in response to a channel selection signal. The subtractor obtains the error voltage by subtracting the digital output voltage from the reference voltage output from the multiplexer. A PI controller generates a control voltage by performing PI control on the error voltage Finally, at least two digital-to-analog converters convert the digital control voltage into an analog control voltage.

The optical power controller may simultaneously drive the at least two laser diodes during the imaging period using the control voltages.

According to another aspect of the present invention, there is provided a method of controlling the power of laser diodes. The method involves the steps of: (a) setting an imaging period and a non-imaging period; (b) generating a first control voltage for driving a first laser diode during the non-imaging period; (c) generating a second control voltage for driving a second laser diode during the non-imaging period; and (d) simultaneously driving the first and second diodes using the first and second control voltages, respectively, during the imaging period.

Step (b) may involve the additional steps of: (e) converting an output voltage of the first laser diode into a digital output voltage; (f) sensing the output voltage of the first laser diode by periodically sampling the output voltage of the first laser diode during the non-imaging period; (g) obtaining an average output voltage of the first laser diode by averaging output voltages sensed during a predetermined sampling cycle; (h) obtaining an error voltage between the average output voltage and a reference voltage; and (i) generating the control voltage by performing PI control on the error voltage.

Step (c) may involve the additional steps of: (j) converting an output voltage of the second laser diode into a digital output voltage; (k) sensing the output voltage of the second laser diode by periodically sampling the output voltage of the second laser diode during the non-imaging period; (l) obtaining an average output voltage of the second laser diode by averaging output voltages sensed during a predetermined sampling cycle; (m) obtaining an error voltage between the average output voltage and a reference voltage; and (n) generating the control voltage by performing PI control on the error voltage.

BRIEF DESCRIPTION OF THE DRAWINGS

The above and other features and advantages of the present invention will become more apparent by describing in detail exemplary embodiments thereof with reference to the attached drawings in which:

FIG. 10 is a detailed flowchart of step 820 of FIG. 8 according to an embodiment of the present invention.

Throughout the drawings, like reference numbers are used to refer to like features and structures.

DETAILED DESCRIPTION OF THE EXEMPLARY EMBODIMENTS

The present invention will now be described more fully with reference to the accompanying drawings, in which exemplary embodiments of the invention are shown. The invention, may, however, be embodied in many different forms and should not be construed as being limited to the embodiments set forth herein. Rather, these embodiments are provided so that this disclosure will be thorough and complete, and will fully convey the concept of the invention to those skilled in the art. Detailed descriptions of known techniques related to the present invention are omitted for clarity.

Figure 1:
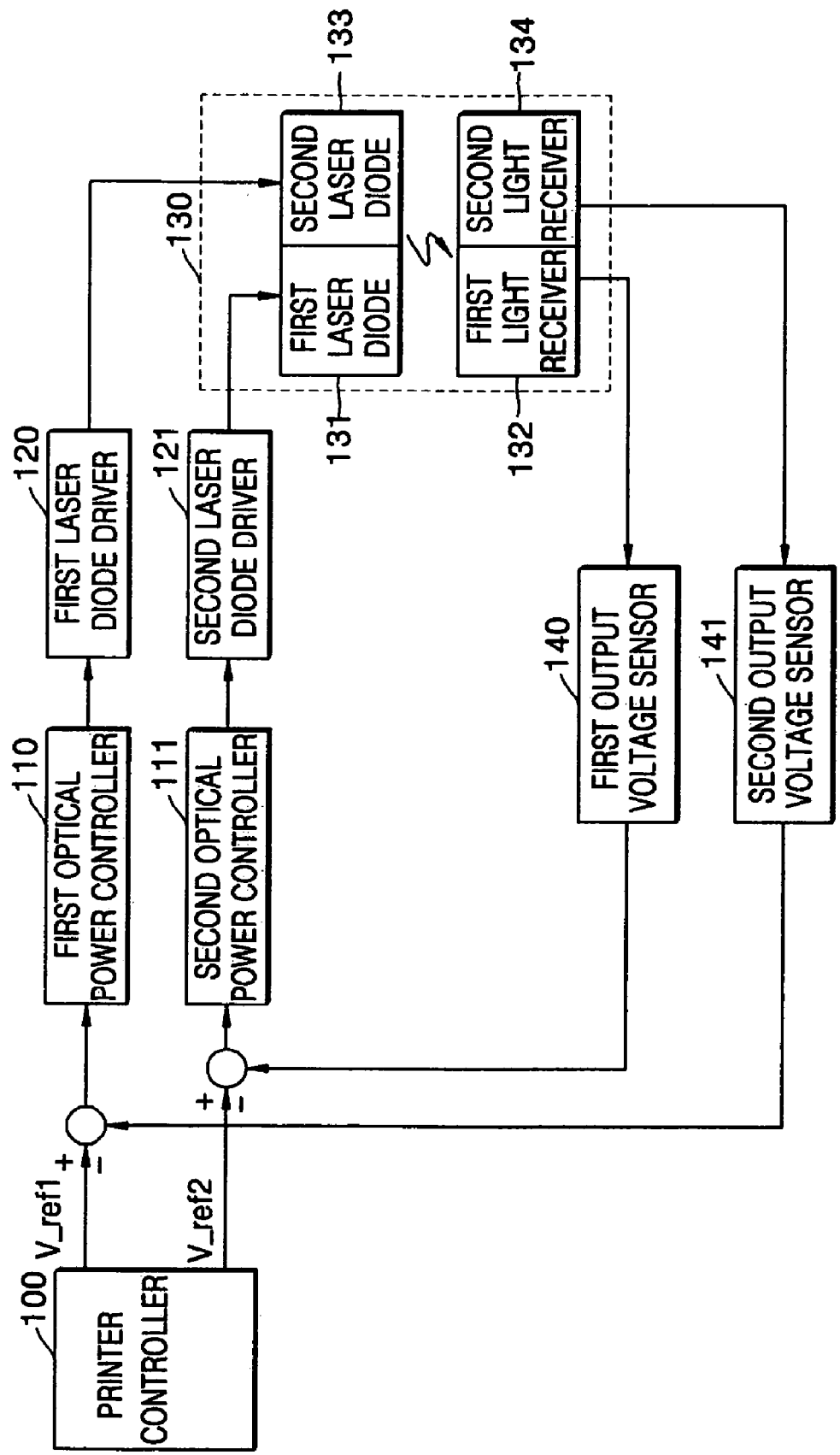
FIG. 1 is a block diagram illustrating a conventional apparatus for controlling the power of laser diodes.
Figure 2:
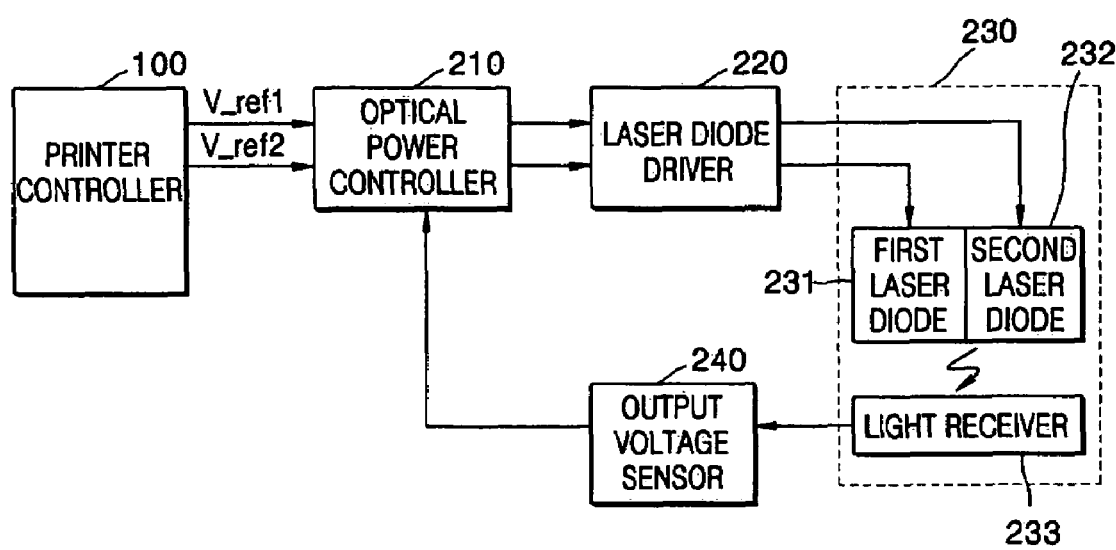
FIG. 2 is a block diagram illustrating an apparatus for controlling the power of laser diodes according to a preferred embodiment of the present invention.

FIG. 2 is a block diagram illustrating an apparatus for controlling the power of laser diodes according to an embodiment of the present invention. Referring to FIG. 2, the apparatus includes a printer controller 100, an optical power controller 210, a laser diode driving unit 220, which includes two or more laser diode drivers, first and second laser diodes 231 and 232, a light receiver 233, and an output voltage sensor 240. In an embodiment of the present invention, the apparatus for controlling the power of laser diodes preferably includes two laser diodes. However, the apparatus for controlling the power of laser diodes may include more than two laser diodes.

The printer controller 100 provides the optical power controller 210 with first and second reference voltages V_ref1 and V_ref2 so that the first and second laser diodes 231 and 232 can, respectively, generate appropriate quantities of light under various circumstances.

The output voltage sensor 240 appropriately processes a voltage sensed from the light receiver 233 in the laser scanning unit 230 and outputs a processing result to the optical power controller 210.

The laser scanning unit 230 further includes a collimator lens (not shown) and a polygonal mirror (not shown). However, detailed descriptions of the collimator lens and the polygonal mirror will not be presented here.

Figure 3:
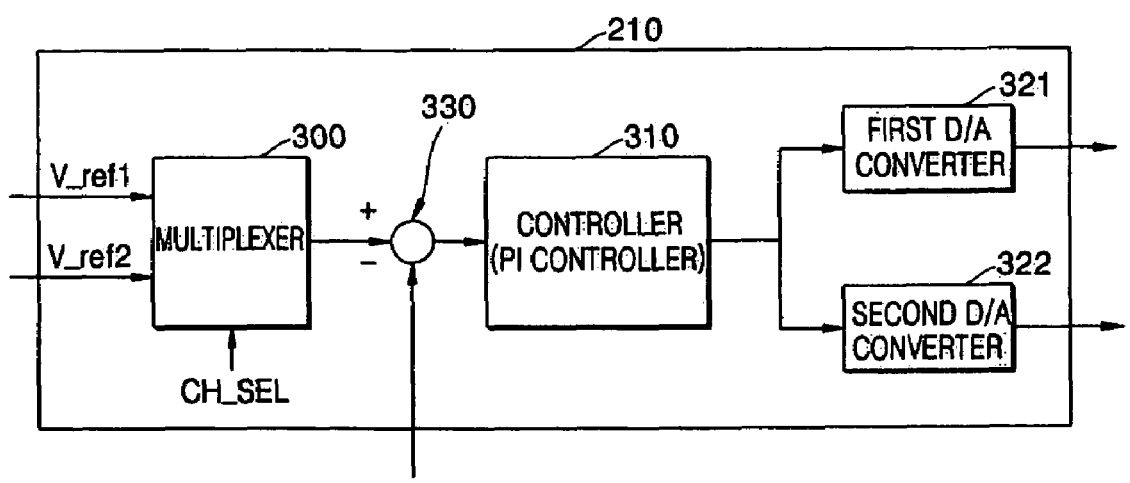
FIG. 3 is a block diagram illustrating an optical power controller of FIG. 2 according to an embodiment of the present invention.

FIG. 3 is a block diagram illustrating the optical power controller 210 of FIG. 2. Referring to FIG. 3, the optical power controller 210 includes a multiplexer 300, a subtractor 330, a proportional-integral (PI) controller 310, and first and second digital-to-analog converters 321 and 322.

The multiplexer 300 receives the first and second reference voltages V_ref1 and V_ref2, selects one of the first and second reference voltages V_ref1 and V_ref2 in response to a channel selection signal CH_SEL, and outputs the selected voltage to the subtractor 330.

The subtractor 330 subtracts an output voltage of the output voltage sensor 240 from the reference voltage output from the multiplexer 300 and outputs an error voltage therebetween to the PI controller 310.

The PI controller 310 generates first and second control voltages for the first and second laser diodes 231 and 232 by performing a PI control on the error voltage during a non-imaging period (700 of FIG. 7) and stores the generated first and second control voltages. Thereafter, during an imaging period (701 of FIG. 7), the PI controller 310 simultaneously drives the first and second laser diodes 231 and 232 using the first and second control voltages so that every two lines of video data can be printed at the same time during the imaging period (701).

Figure 4:
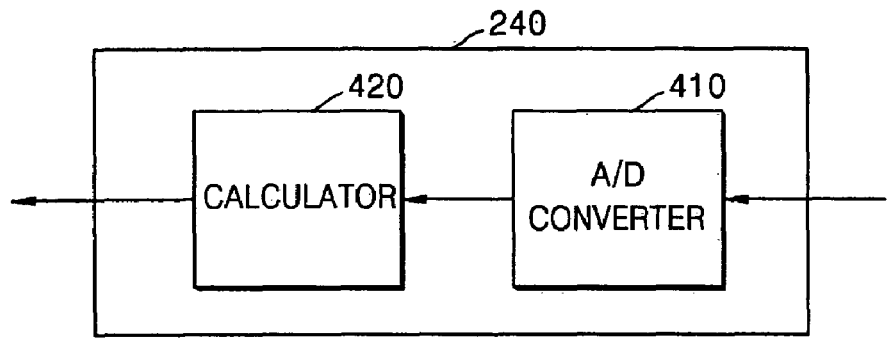
FIG. 4 is a block diagram illustrating a calculator of FIG. 2 according to an embodiment of the present invention.

FIG. 4 is a block diagram illustrating the output voltage sensor 240 of FIG. 2. Referring to FIG. 4, the output voltage sensor 240 includes an analog-to-digital converter 410, which receives an analog output voltage sensed from the light receiver 233 and converts the received analog output voltage into a digital output voltage. A calculator 420, which periodically samples the digital output power, converts a sampling result into a voltage with an appropriate form, and outputs the voltage to the optical power controller 210.

Figure 5:
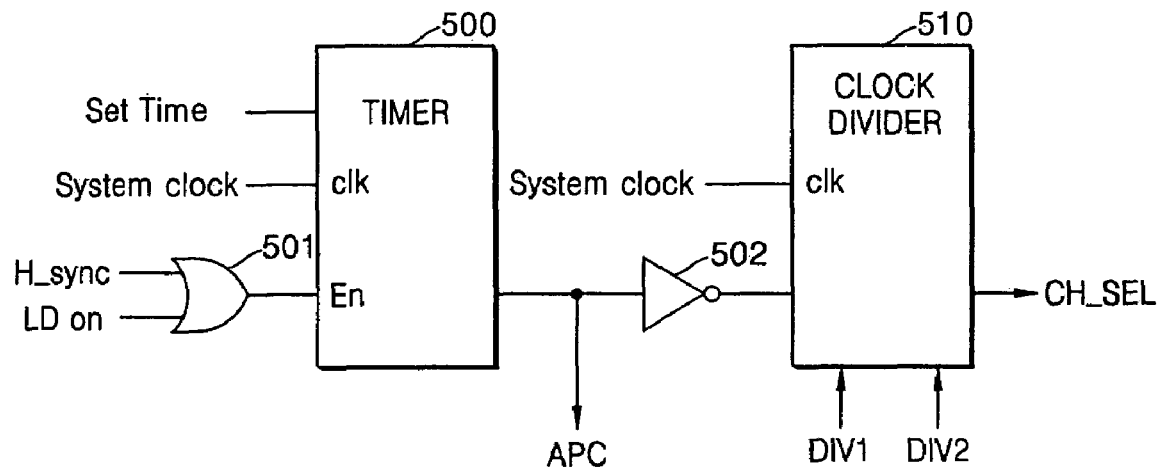
FIG. 5 is a circuit diagram illustrating a timer and a clock divider, which generate an auto power control signal APC and a channel selection signal CH_SEL, respectively, according to an embodiment of the present invention.

FIG. 5 is a circuit diagram illustrating a timer 500 and a clock divider 510, which generate an auto power control signal (APC) and the channel selection signal (CH_SEL), respectively. Referring to FIG. 5, a timer 500 is enabled when a paper edge sensing signal Hsync and a diode turn-on signal (LD_ON) are all set to 0 and starts to count clocks of a system clock signal (SYS_CLK) during predetermined setting time (SET_TIME). After the predetermined setting time (SET_TIME), the timer 500 sets the auto power control signal APC to a logic high level.

The clock divider 510 is enabled in response to an inverse signal of the auto power control signal APC_generated from the timer 500 and counts first laser diode output control time DIV1 and second laser diode output control time DIV2 in synchronization with the system clock signal SYS_CLK, thereby generating the channel selection signal CH_SEL.

Figure 6:
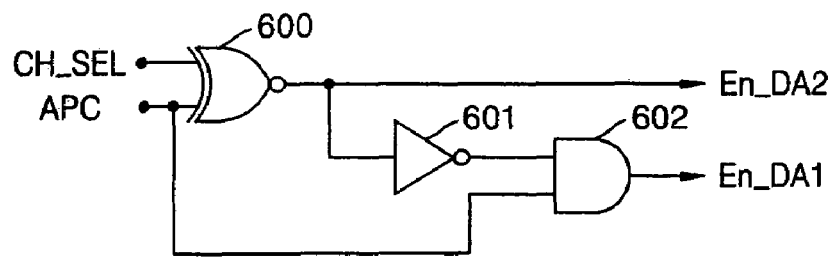
FIG. 6 is a circuit diagram illustrating logic gates, which selectively enable a digital-to-analog converter according to an embodiment of the present invention.

FIG. 6 is a circuit diagram illustrating logic gates 600 through 602, which selectively enable the digital-to-analog converter 321 or 322 according to an embodiment of the present invention. Referring to FIG. 6, the logic gates 600 through 602 selectively drive the digital-to-analog converter 321 or 322 in response to the channel selection signal CH_SEL and the auto power control signal APC.

Figure 7:
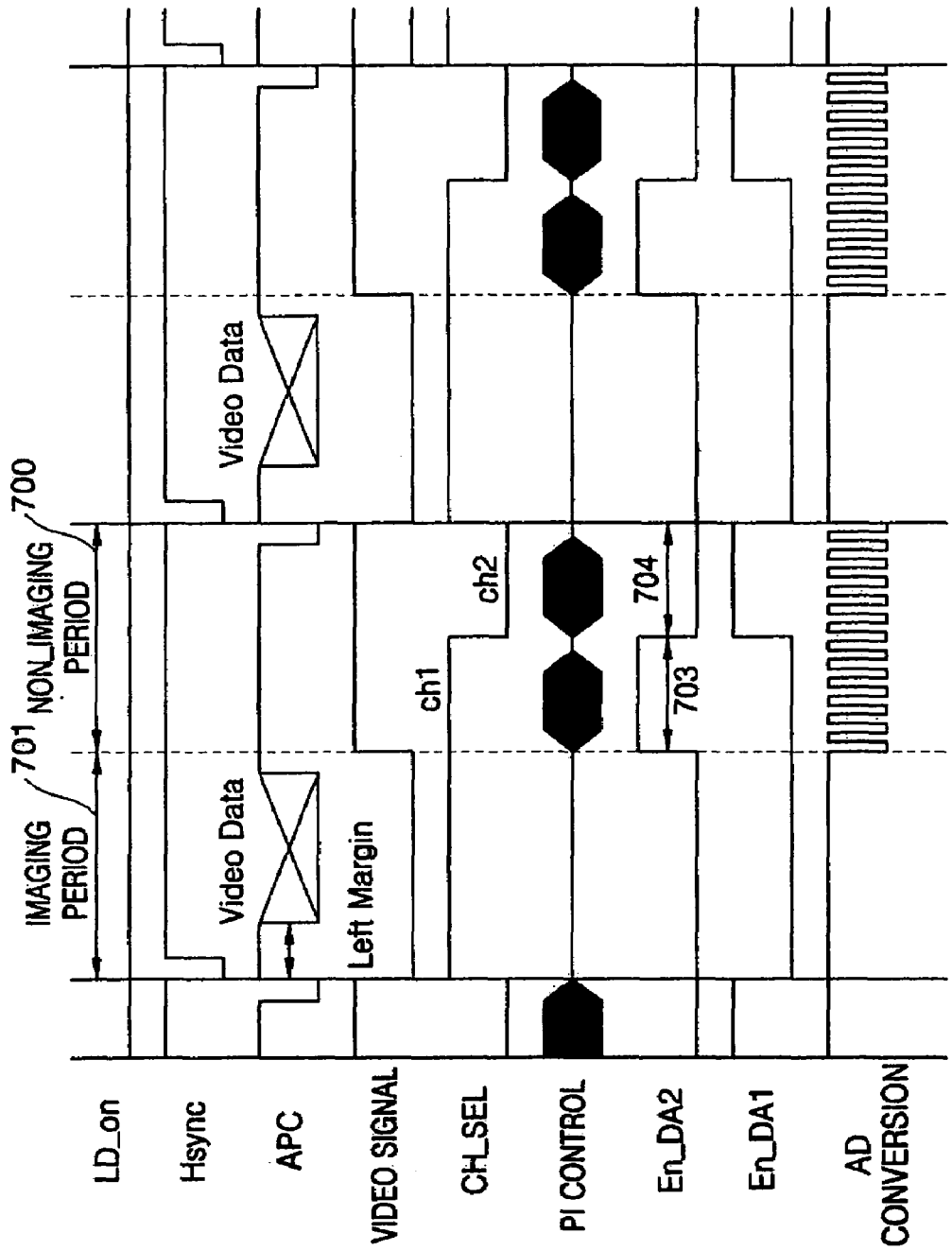
FIG. 7 is a timing diagram of signals input into or output from the apparatus for controlling the power of laser diodes according to the preferred embodiment of the present invention.

FIG. 7 is a timing diagram illustrating signals input into or output from the apparatus for controlling the power of laser diodes according to an embodiment of the present invention. Referring to FIG. 7, LD_ON represents a signal for turning on laser diodes, and Hsync represents a signal for sensing either edge of a sheet of printing paper. LD_ON and Hsync are preferably both output from the laser scanning unit 230.

During the non-imaging period 700, the auto power control signal APC is logic high. The channel selection signal CH_SEL enables the optical power controller 210 to sequentially control the two diodes 231 and 232 during the non-imaging period 700. During the non-imaging period 700, a PI control is carried out. EN_DA1 and EN_DA2 represent signals for sequentially enabling the first and second digital-to-analog converters 321 and 322, respectively, which respectively convert first and second analog control voltages output from the PI Controller into a digital output voltage during the non-imaging period 700. AD CONVERSION represents the conversion of an analog output voltage into a digital output voltage during the non-imaging period 700.

When the laser scanning unit 230 senses a sheet of printing paper, it generates the paper edge sensing signal Hsync. When the completed image representing the video data is printed on the printing paper and either edge of the printing paper is detected, the logic level of the paper edge sensing signal Hsync is shifted from 'high' to 'low'.

Once the paper edge sensing signal Hsync is set to a logic low level after the imaging period 701, a control operation, such as PI control, is performed to generate the first and second control voltages, which respectively approximate the first (V_ref1) and second (V_ref2) reference voltages output from the printer controller 100. The imaging period 701 lasts for about 400 µs, and the non-imaging period 700 lasts for about 100 µs. However, their durations may vary depending on the printing speed or printing environment.

The auto power control signal APC is a benchmark for differentiating the non-imaging period 700 from the imaging period 701 and is generated by the timer 500 of FIG. 5. In other words, when the paper edge sensing signal Hsync and the laser diode turn-on signal LD_ON are all set to 0, the timer 500 starts to count clocks of the system clock signal SYS_CLK. After the predetermined setting time SET_TIME, the timer 500 sets the auto power control signal APC to a logic high level, and a control operation, such as PI control, is initiated.

As shown in FIG. 5, when an inverse signal of the auto power control signal APC is input into the clock divider 510, the clock divider 510 is enabled and counts the first laser diode control time DIV1 and the second laser diode control signal DIV2 in synchronization with the system clock signal SYS_CLK, thereby generating the clock selection signal CH_SEL.

In the present embodiment, the non-imaging period 700 for the first laser diode 231 lasts for about 50 µs, which is half of the duration of the entire non-imaging period 700. Therefore, in order to generate first and second control voltages, which respectively approximate the first (V_ref1) and second (V_ref2) reference voltages, for about 50 µs, each of the first (V_ref1) and second (V_ref2) reference voltages should be controlled.

The logic gates 600 through 602, which generate signals for enabling the first and second digital-to-analog converters 321 and 322, are illustrated in FIG. 6.

The operation of the apparatus for controlling the power of laser diodes according to the preferred embodiment of the present invention will now be described more fully with reference to FIGS. 3 through 7.

During the non-imaging period 700, a control operation, such as PI control, is performed to generate first and second control voltages, which respectively approximate the first (V_ref1) and second (V_ref2) reference voltages. During the imaging period 701, at least two laser diodes are simultaneously driven using the first and second control voltages generated during the non-imaging period 700. Upon driving the laser diodes, two lines of video data are imaged on a photosensitive drum. Finally, a resultant latent image on the photosensitive drum is transferred onto a sheet of printing paper.

As shown in FIG. 7, the non-imaging period 700 is divided into first and second sub-periods 703 and 704. During the first sub-period 703, a control operation is carried out to generate a first control voltage for driving the first laser diode 231, which approximates the first reference voltage V_ref1.

During the sub-period 703, the light receiver 233 receives a predetermined quantity of laser light and generates an output voltage based on the received laser light. The output voltage sensor 240 senses the output voltage received from the light receiver 233 by periodically sampling the corresponding output voltage during the sub-period 703.

In order to digitally control the sensed analog output voltage, the sensed analog output voltage is converted into a digital output voltage by the analog-to-digital converter 410, and a conversion result is input into the calculator 420.

The operation of the calculator 420 is described as follows. The calculator 420 sets a maximum and a minimum for a valid output voltage range in advance and compares the output voltage received from the analog-to-digital converter 410 with the maximum or minimum to determine whether the received output voltage is within the valid output voltage range. Thereafter, the calculator 420 accumulates only valid output voltages that fall into the valid output voltage range, counts the valid output voltages, and divides an accumulation result by the number (N) of valid output voltages, thereby obtaining an average output voltage. The average output voltage is multiplied by a predetermined constant Km in order to simplify decimal fraction calculations to be performed by the optical power controller 210. Thereafter, the result of the multiplication is output to the optical power controller 210.

The multiplexer 300 in the optical power controller 210 receives the first reference voltage V_ref1 for driving the first laser diode 231 in response to the channel selection signal CH_SEL. The subtractor 330 subtracts the average output voltage multiplied by the predetermined constant Km received from the calculator 420 from the first reference voltage V_ref1 received from the multiplexer 300. The subtractor 330 applies the subtraction result to the PI controller 310. The PI controller 310 performs PI control, thereby generating a control voltage, which approximates the first reference voltage V_ref1. The control voltage is divided by the predetermined constant Km, and a division result is stored in a RAM (not shown) in the optical power controller 210. The PI control has been disclosed in literature, and thus its detailed description will not be presented here. An optimal proportional constant and an optimal integral constant are set using a cut-and-try method.

A second control voltage for driving the second laser diode 232 is generated during the sub-period 704 in the same manner as described above that generates the first control voltage for driving the first laser diode 231 during the sub-period 703. The second control voltage, like the first control voltage, is stored in the RAM (not shown) in the optical power controller 210.

Therefore, once the first and second control voltages for respectively driving the first and second laser diodes 231 and 232 are obtained, the optical power controller 210 simultaneously drives the first 231 and second 232 laser diodes. The first 231 and second 232 laser diodes are driven using the first and second control voltages so that two lines of a latent image on a photosensitive drum can be transferred onto a sheet of printing paper at the same time.

Figure 8:
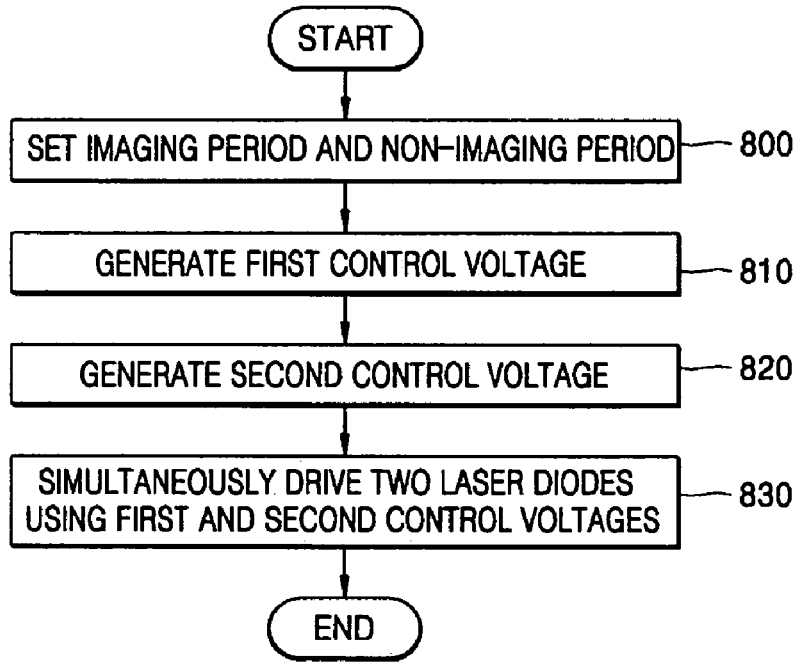
FIG. 8 is a flowchart illustrating a method of controlling the power of laser diodes according to a preferred embodiment of the present invention.

FIG. 8 is a flowchart illustrating a method of controlling the power of laser diodes according to a preferred embodiment of the present invention. Referring to FIG. 8, the method of controlling the power of laser diodes involves setting the non-imaging period 700 and the imaging period 701 (step 800), generating a first control voltage for driving the first laser diode 231 (step 810), generating a second control voltage for driving the second laser diode 232 (step 820), and simultaneously driving the first and second laser diodes 231 and 232 using the first and second control voltages (step 830).

Figure 9:
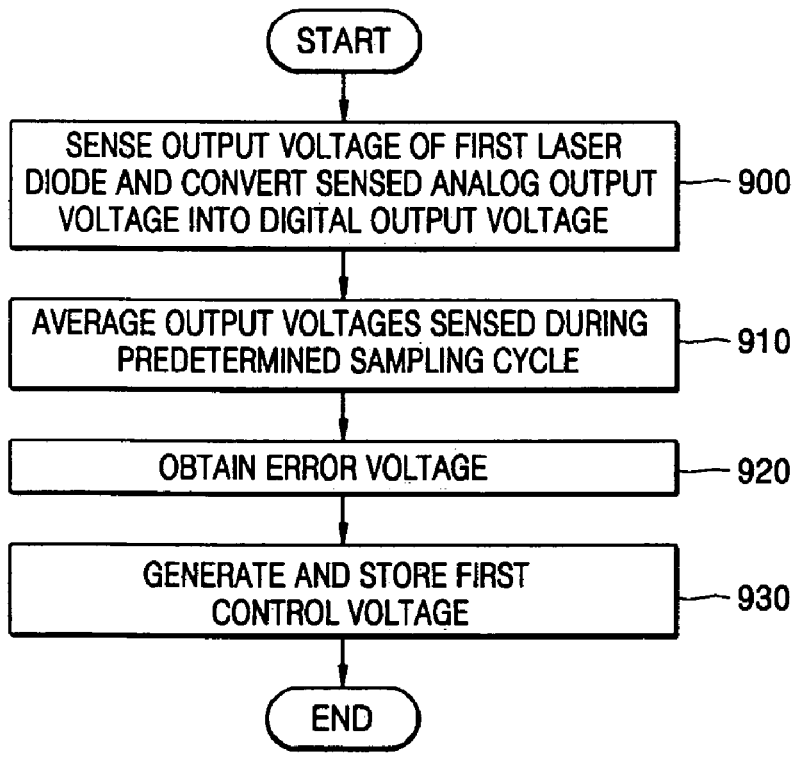
FIG. 9 is a detailed flowchart of step 810 of FIG. 8 according to an embodiment of the present invention.

FIG. 9 outlines the steps that comprise step 810 of FIG. 8 according to an embodiment of the present invention. Step 810 involves sensing an analog output voltage of the first laser diode 231 during the non-imaging period 700 and then converting the analog output voltage into a digital output voltage (step 900), averaging output voltages sensed during a predetermined sampling cycle (step 910), obtaining an error voltage between an average output voltage and the first reference voltage V_ref1 (step 920), and generating the first control voltage by performing PI control on the error voltage (step 930).

More specifically, in step 900, the output voltage of the first laser diode 231 is sensed by periodically sampling the corresponding output voltage during the non-imaging period 700. The sensed output voltage of the first laser diode 231 is converted into a digital output voltage.

In step 910, it is determined whether the digital output voltage is within a valid output voltage range by comparing the digital output voltage with a minimum and a maximum of the valid output voltage range. Thereafter, only valid digital output voltages within the valid output voltage range are accumulated and are counted, and then an accumulation result is divided by the number (N) of valid digital output voltages, thereby obtaining an average output voltage. The average output voltage is multiplied by the predetermined constant Km in order to simplify decimal fraction calculations.

In step 920, the average output voltage is subtracted from the first reference voltage V_ref1, thereby obtaining the error voltage.

In step 930, the first control voltage, which approximates the first reference voltage V_ref1, is generated by performing PI control on the error voltage. The first control voltage is divided by the predetermined constant Km, and a division result is stored.

Step 820 is shown in greater detail in FIG. 10. Step 820 involves sensing an analog output voltage of the second laser diode 232 during the non-imaging period 700 and then converting the analog output voltage into a digital output voltage (step 1000), averaging output voltages sensed during a predetermined sampling cycle (step 1010), obtaining an error voltage between an average output voltage and the second reference voltage V_ref2 (step 1020), and generating the second control voltage by performing PI control on the error voltage (step 1030).

More specifically, in step 1000, the output voltage of the second laser diode 232 is sensed by periodically sampling the corresponding output voltage during the non-imaging period 700. The sensed output voltage of the second laser diode 232 is converted into a digital output voltage.

In step 1010, it is determined whether the digital output voltage is within a valid output voltage range by comparing the digital output voltage with a minimum and a maximum of the valid output voltage range. Thereafter, only valid digital output voltages within the valid output voltage range are accumulated and are counted, and then an accumulation result is divided by the number (N) of valid digital output voltages, thereby obtaining an average output voltage. The average output voltage is multiplied by the predetermined constant Km in order to simplify decimal fraction calculations.

In step 1020, the average output voltage is subtracted from the second reference voltage V_ref2, thereby obtaining the error voltage.

In step 1030, the second control voltage, which approximates the second reference voltage V_ref2, is generated by performing PI control on the error voltage. The second control voltage is divided by the predetermined constant Km, and a division result is stored.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for controlling the power of laser diodes, which generates control voltages during a non-imaging period and drives laser diodes using the control voltages during an imaging period, the apparatus comprising:
    an output voltage sensor, which senses output voltages of at least a first and second laser diode and outputs the output voltages to an optical power controller,
    wherein said output voltage sensor comprises an analog-to-digital converter, which converts an analog output voltage into a digital output voltage, and a calculator, which processes the digital output voltage and outputs a processing result to said optical power controller, wherein said calculator receives a digital output voltage of the second laser diode at every predetermined sampling cycle during the non-imaging period, averages the digital output voltage input of the second laser diode during each said predetermined sampling cycle, and outputs an average digital output voltage to said optical power controller; and the optical power controller, which generates control voltages for controlling the at least first and second laser diodes by performing a proportional-integral (PI) control on error voltages between reference voltages and the output voltages for first and second laser diodes received from the output voltage sensor during the non-imaging period, drives a first laser diode during the non-imaging period, and simultaneously drives the at least first and second laser diodes during the imaging period.

2. An apparatus for controlling the power of laser diodes, which generates control voltages during a non-imaging period and drives laser diodes using the control voltages during an imaging period, the apparatus comprising:

an output voltage sensor, which senses output voltages of at least two laser diodes and outputs the output voltages to an optical power controller; and the optical power controller, which generates control voltages for controlling the at least two laser diodes by performing a proportional-integral (PI) control on error voltages between reference voltages and the output voltages received from the output voltage sensor;

wherein the optical power controller comprises:

a multiplexer, which selectively outputs one of the reference voltages to said optical power controller in response to a channel selection signal;

a subtractor, which obtains the error voltage by subtracting the digital output voltage from the reference voltage output from the multiplexer;

a PI controller, which generates a control voltage by performing PI control on the error voltage; and at least two digital-to-analog converters, which convert the digital control voltage into an analog control voltage.

3. A method of controlling the power of laser diodes, comprising:

setting an imaging period and a non-imaging period;

converting an output voltage of the second laser diode into a digital output voltage;

sensing the output voltage of the second laser diode by periodically sampling the output voltage of the second laser diode during the non-imaging period;

obtaining an average output voltage of the second laser diode by averaging output voltages sensed during a predetermined sampling cycle;

obtaining an error voltage between the average output voltage and a reference voltage;

generating a first and second control voltage for driving a first and second laser diode by performing PI control on the error voltage;

driving a first laser diode during the non-imaging period;

driving a second laser diode during the non-imaging period; and simultaneously driving the first and second diodes using the first and second control voltages, respectively, during the imaging period.

4. A method of controlling the power of laser diodes, comprising:

setting an imaging period and a non-imaging period;

(b) generating a first control voltage for driving a first laser diode during the non-imaging period;

(c) generating a second control voltage for driving a second laser diode during the non-imaging period; and (d) simultaneously driving the first and second diodes using the first and second control voltages, respectively, during the imaging period;

wherein step (b) comprises:

(e) converting an output voltage of the first laser diode into a digital output voltage;

(f) sensing the output voltage of the first laser diode by periodically sampling the output voltage of the first laser diode during the non-imaging period;

(g) obtaining an average output voltage of the first laser diode by averaging output voltages sensed during a predetermined sampling cycle;

(h) obtaining an error voltage between the average output voltage and a reference voltage; and (i) generating the control voltage by performing PI control on the error voltage.

5. A method of controlling the power of laser diodes, comprising:

(a) setting an imaging period and a non-imaging period;

(b) generating a first control voltage for driving a first laser diode during the non-imaging period;

(c) generating a second control voltage for driving a second laser diode during the non-imaging period; and (d) simultaneously driving the first and second diodes using the first and second control voltages, respectively, during the imaging period;

wherein step (c) comprises:

(j) converting an output voltage of the second laser diode into a digital output voltage;

(k) sensing the output voltage of the second laser diode by periodically sampling the output voltage of the second laser diode during the non-imaging period;

(l) obtaining an average output voltage of the second laser diode by averaging output voltages sensed during a predetermined sampling cycle;

(m) obtaining an error voltage between the average output voltage and a reference voltage; and (n) generating the control voltage by performing PI control on the error voltage.

* * * * *